(12) United States Patent
Patel et al.

(10) Patent No.: US 10,007,745 B2
(45) Date of Patent: Jun. 26, 2018

(54) CONVERSION OF GEOMETRIC ENTITIES OF 1D ELEMENTS IN A FEM FROM A SOURCE FEA TOOL FORMAT TO A DESTINATION FEA TOOL FORMAT

(71) Applicants: AIRBUS GROUP INDIA PRIVATE LIMITED, Bangalore (IN); AIRBUS OPERATIONS S.L., Getafe (ES)

(72) Inventors: Soham Narayan Patel, Bangalore (IN); Amit Chaudhari, Bangalore (IN); Abhishek Dwivedi, Bangalore (IN); Jorge Gonzalez Rubio, Getafe (ES)

(73) Assignee: AIRBUS GROUP INDIA PRIVATE LIMITED, Bangalore, Karnataka (IN)

( * ) Notice: Subject to any disclaimer, the term of this patent is extended or adjusted under 35 U.S.C. 154(b) by 391 days.

(21) Appl. No.: 14/894,376

(22) PCT Filed: May 27, 2013

(86) PCT No.: PCT/IN2013/000337
§ 371 (c)(1),
(2) Date: Nov. 27, 2015

(87) PCT Pub. No.: WO2014/192003
PCT Pub. Date: Dec. 4, 2014

(65) Prior Publication Data
US 2016/0132622 A1    May 12, 2016

(51) Int. Cl.
G06F 17/10 (2006.01)
G06F 17/50 (2006.01)
G06F 17/16 (2006.01)

(52) U.S. Cl.
CPC .......... G06F 17/5018 (2013.01); G06F 17/10 (2013.01); G06F 17/16 (2013.01)

(58) Field of Classification Search
CPC .................................................. G06F 17/5018
USPC .......................................................... 703/2
See application file for complete search history.

(56) References Cited

U.S. PATENT DOCUMENTS 8,355,893 B2 * 1/2013 Suresh ................ G06F 17/5018
700/98

* cited by examiner

*Primary Examiner* — Andy Ho
(74) *Attorney, Agent, or Firm* — Prakash Nama; Global IP Services, PLLC

(57) ABSTRACT

System and method of converting geometric entities of 1D elements in a finite element model (FEM) from a source finite element analysis (FEA) tool format to a destination FEA tool format is disclosed. In one embodiment, coordinates of all the geometric entities associated with each 1D element in the FEM are transformed from the source FEA tool format to a global coordinate system. The geometric entities of the ID elements in the FEM are then converted from the source FEA tool format to the destination FEA tool format using the transformed coordinates of all the geometric entities associated with each 1D element.

21 Claims, 9 Drawing Sheets

CONVERSION OF GEOMETRIC ENTITIES OF 1D ELEMENTS IN A FEM FROM A SOURCE FEA TOOL FORMAT TO A DESTINATION FEA TOOL FORMAT

FIELD OF TECHNOLOGY

Embodiments of the present subject matter generally relate to finite element modeling, and more particularly, to 1D element in finite element modeling.

BACKGROUND

Typically, more than one finite element analysis (FEA) tool is used in analyzing a structure. For example, in aircraft analysis, it is common to use one FEA tool for linear analysis and later another one for non-linear analysis. Further, typically, depending on the size of a structure, it can take several hours to years in building a finite element model (FEM) based on a FEA tool. It can be envisioned that the redundant task of rebuilding a finite element model from scratch for one or more other FEA tools can be very time consuming and typically, this is overcome by using commercially available finite element translators provided by the tool providers.

However, these finite element translators, typically, do a good job of accurately translating 2D and 3D elements, loads, constraints, coordinate system and so on, but fail to accurately translate geometric entities of 1D elements of finite element model, such as rod, beam and bar. For example, one finite element tool may define a 1D element with varying cross sectional area and the other finite element tool may not. In another example, one finite element tool may provide provision to define shift vectors in offset and local coordinate system and another finite element tool may only define in offset coordinate system. In yet another example, one finite element tool may provide the feature of releasing certain degree of freedom (DOF) and the other finite element tool may not. This may result in un-rectifiable errors in translation of geometric entities of 1D elements such as erroneous translation of orientation vector which can lead to erroneous formation of elemental coordinate system and swapped cross section (C/S) properties. Exemplary erroneous formation of elemental coordinate system and swapped C/S properties include swapped moment of inertia about elemental axis, faulty translation of transverse shear stiffness, failing to convert neutral axis (NA) offset with respect to shear center (SC), failing to translate correct format, and failing to release degree of freedom (DOF) at end nodes, and so on.

In a typical, finite element model, there can be as many as 50,000 or more 1D elements and one can envision that by using such commercially available translators may result in building a significantly inaccurate FEM.

SUMMARY

System and method of converting geometric entities of one or more 1D elements in a finite element model (FEM) from a source FEA tool format to a destination tool format are disclosed. According to one aspect of the present subject matter, coordinates of all the geometric entities associated with each 1D element format are translated to the global coordinate system. The geometric entities of the 1D elements in the FEM are then converted from the source FEA tool format to the destination FEA tool format using the transformed coordinates of all the geometric entities associated with each 1D element.

According to another aspect of the present subject matter, a transformation matrix and a shift matrix is generated for each local coordinate system in the FEM of source FEA tool format. Coordinates of each node in a current 1D element are transformed from the local coordinate system to a global coordinate system using the generated transformation matrix and the shift matrix associated with the local coordinate system. The orientation vector of the current 1D element is then transformed from the local coordinate system to the global coordinate system using the generated transformation matrix and the shift matrix associated with the local coordinate system. The offset coordinate system is then formulated and an associated transformation matrix and shift matrix is then generated using coordinates of end nodes of the current 1D element and the transformed orientation vector in the global coordinate system. All the geometric entities of the current 1D element defined in the offset coordinate system is then transformed from the offset coordinate system to the global coordinate system using the generated transformation matrix and the shift matrix of each associated offset coordinate system. The elemental coordinate system of the current 1D element is then formulated and an associated transformation matrix and shift matrix are then generated. All the geometric entities of the current 1D element defined in the elemental coordinate system are then transformed from the elemental coordinate system to the global coordinate system using the generated transformation matrix and the shift matrix of associated elemental coordinate system. The geometric entities of the current 1D element in the source FEA tool format is then converted to the destination FEA tool format using the transformed local, offset and elemental coordinate system to the global coordinate system. The above outlined steps are then repeated for a next 1D element until the conversion of all the 1D elements in the FEM that are in the source FEA tool format are completed.

The systems and methods disclosed herein may be implemented in any means for achieving various aspects. Other features will be apparent from the accompanying drawings and from the detailed description that follow.

BRIEF DESCRIPTION OF THE DRAWINGS

Various embodiments are described herein with reference to the drawings, wherein.

Figure 1:
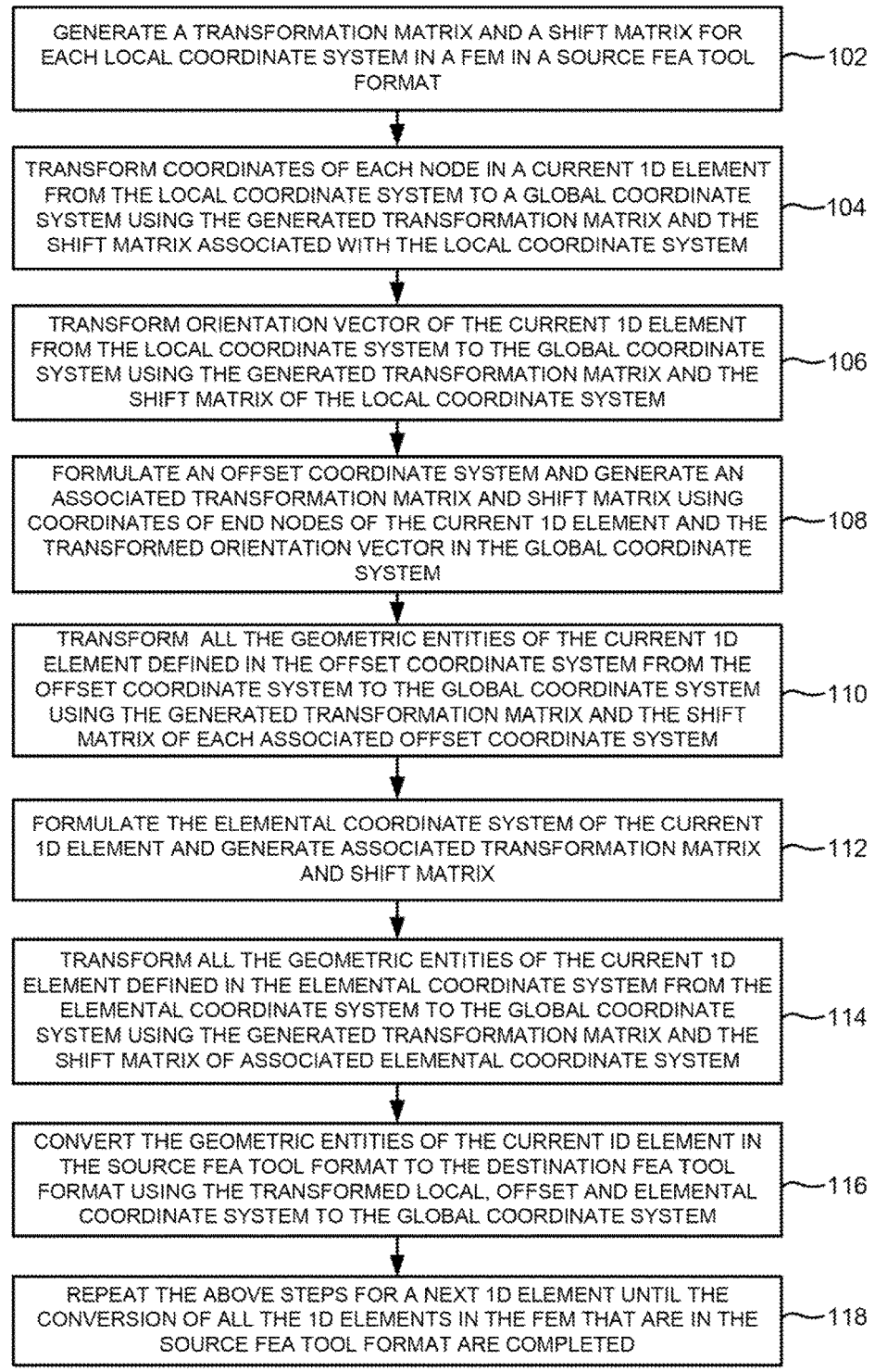
FIG. 1 shows an exemplary method for converting geometric entities of 1D elements in a finite element model (FEM) created in a source finite element analysis (FEA) tool format to a destination FEA tool format, according to one embodiment.

The drawings described herein are for illustration purposes only and are not intended to limit the scope of the present disclosure in any way.

DETAILED DESCRIPTION

System and method of converting geometric entities of one or more 1D elements in a finite element model (FEM), from a source finite element analysis (FEA) tool format to a destination FEA tool format are disclosed. In the following detailed description of the embodiments of the present subject matter, references are made to the accompanying drawings that form a part hereof, and in which are shown by way of illustration specific embodiments in which the present subject matter may be practiced. These embodiments are described in sufficient detail to enable those skilled in the art to practice the present subject matter, and it is to be understood that other embodiments may be utilized and that changes may be made without departing from the scope of the present subject matter. The following detailed description is, therefore, not to be taken in a limiting sense, and the scope of the present subject matter is defined by the appended claims.

The terms "converting" and "translating" are used interchangeably throughout the document. The term "geometric entity" refers to coordinates, vectors, nodes, shear center, neutral axis and the like. Further, the terms "global coordinate system", "local coordinate system", "offset coordinate system", and "elemental coordinate system" refer to "X, Y, Z", "x, y, z", "$x_1, y_1, z_1$" and "$x_2, y_2, z_2$" coordinate systems, respectively, throughout the document. Furthermore, the term "CS" refers to coordinate system throughout the document.

Example embodiments proposes an amalgamation of algorithms, techniques and rules to overcome the drawbacks associated with translation of geometric entities of 1D elements in a format of one solver (FEA tool) to the format of another FEA tool. The proposed example algorithm/technique/rules/formulas proposed are implemented in the form of script/codes/program written in Python programming language® to perform the task of converting geometric entities of Nastran based 1D elements to equivalent entities of Abaqus® based 1D elements. Most of the solvers provide a library of 1D elements with different features (physical properties), such as axial stiffness, torsional stiffness, bending stiffness, transverse shear stiffness, warping, stress recovery and the like. For example, 1D elements available in Nastran are represented as CROD, CBAR, CBAEM, and so on having different physical features. Whereas in Abaqus, they are available as B31 B32 B33, B31H, B32H, B33H, FRAME3D, B21, B22, B23, B21H, B22H, B23H, and so on. Its the task of a user/modeller/designer/FE analyst to select the appropriate element best suited for a desired purpose. Further, the proposed example embodiments address geometric differences between the 1D elements generated using one FEA tool format to another and their conversion/translation algorithms.

Example Processes

Example embodiment includes transforming the coordinates of all the geometric entities associated with each 1D element in the FEM in a source FEA tool format from a local coordinate system to a global coordinate system. The geometric entities of each 1D element in the FEM is then converted to the destination FEA tool format using the transformed coordinates of all the geometric entities associated with each 1D element in the global coordinate system.

Figure 2A:
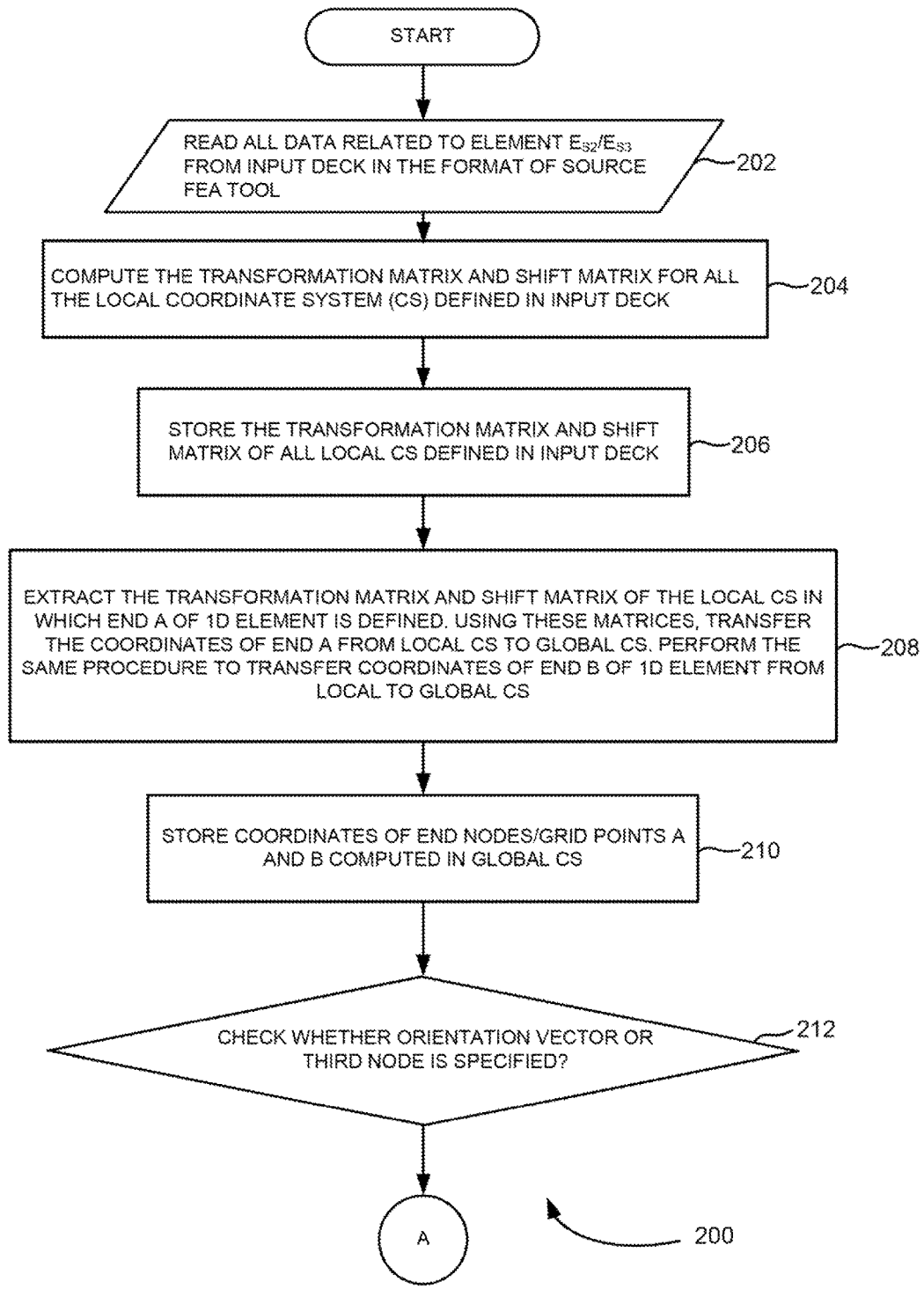
FIG. 2 shows another exemplary method for converting geometric entities of 1D elements in an FEM created in a source FEA tool format to a destination FEA tool format, according to one embodiment.

FIG. 1 illustrates a flowchart 100 for converting geometric entities of 1D elements in a FEM created in a source FEA tool format to a destination FEA tool format, according to one embodiment. In block 102, a transformation matrix and a shift matrix is generated for each local coordinate system in the FEM in the source FEA tool format. In block 104, coordinates of each node in a current 1D element is transformed from the local coordinate system to a global coordinate system using the generated transformation matrix and the shift matrix associated with the local coordinate system. The process outlined in blocks 102 and 104 are explained in more detail in FIG. 2A steps 202-210.

One example geometrical entity related to 1D elements is the elemental coordinate system and to create/form the elemental coordinate system any one of the following is required:

three non-coincident points
two points and a vector
two non-parallel vectors.

In 1D element of any solver, if information of at least two points (i.e., end nodes/grid points of 1D element) is known, then additional information of either a vector or a third node/grid point is required to create the elemental coordinate system. Typically, most commercially available solvers, provide the feature of specifying either a vector or a third grid point/node to form the elemental coordinate systems. Solvers refer to this vector as "orientation vector" (v). If a user specifies the third node then the solvers internally create the orientation vector starting from first node in element connectivity and ending at a third node. Using this additional vector (i.e., orientation vector) or the third node grid point, solver internally creates the elemental coordinate system.

Figure 2B:
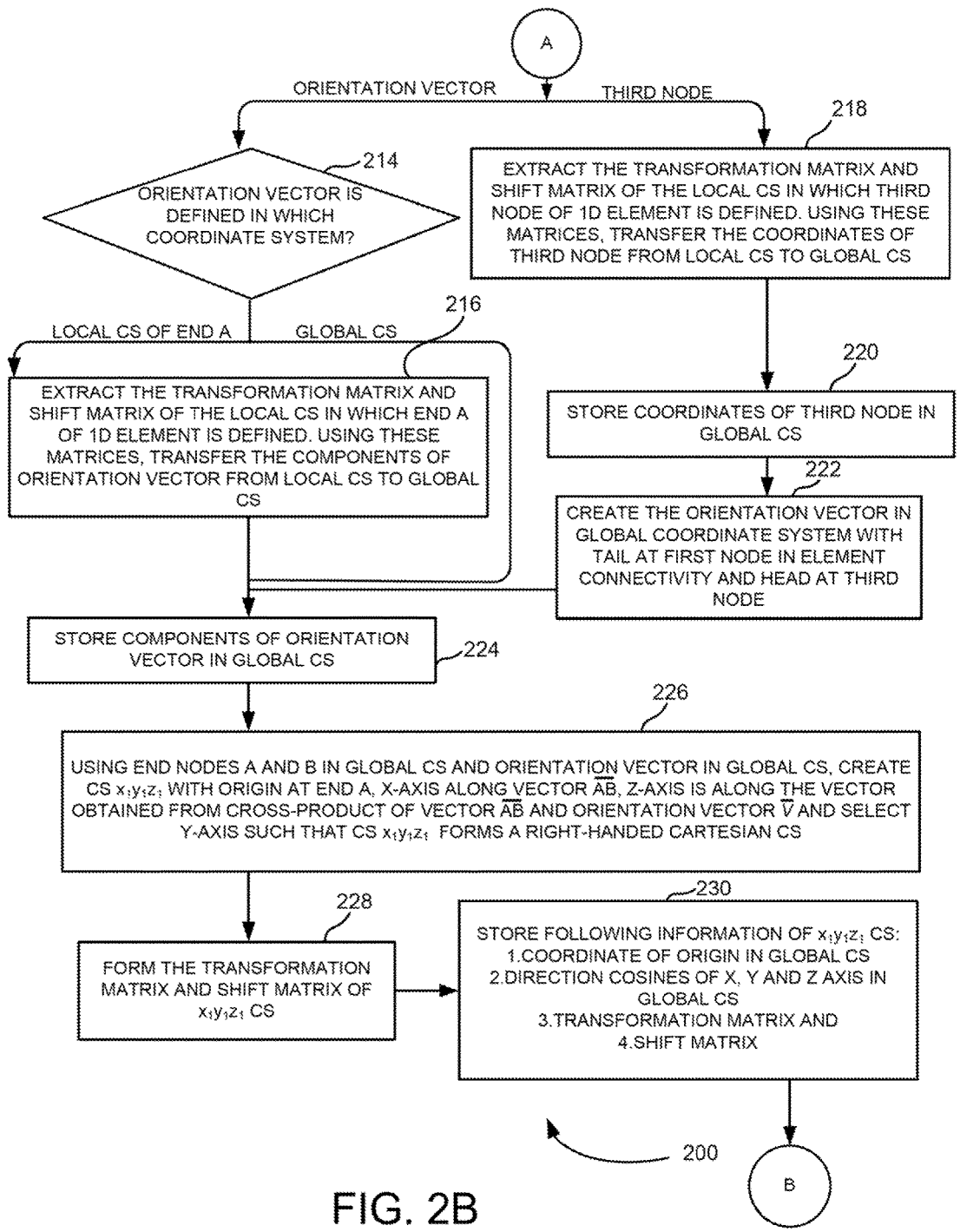

In block 106, an orientation vector of the current 1D element is transformed from the local coordinate system to a global coordinate system using the generated transformation matrix and the shift matrix associated with the local coordinate system. In some embodiments, block 106 includes determining whether an orientation vector or a third node is specified for the current 1d element in the FEM to create the offset coordinate system, if orientation is defined using the orientation vector, and the orientation vector is in the local coordinate system then the orientation vector of the current 1D element is transformed from the local coordinate system to the global coordinate system using the generated transformation matrix and the shift matrix associated with the local coordinate system. However, if orientation of the current 1D element in the FEM is defined using the third node, then the transformation matrix and shift matrix in which the third node of the current 1D element is defined is extracted. The coordinates of the third node from the local coordinate system are transformed to the global coordinate system. The orientation vector in the global coordinate system is formed with the tail at first node in the element connectivity of the current 1D element and the head at the third node using the coordinates of both nodes in global coordinate system. This is explained in more detail in FIG. 2B steps 212 to 226.

In block 108, an offset coordinate system is formulated and then an associated transformation matrix and shift matrix is generated using coordinates of end nodes of the current 1D element and the transformed orientation vector in the global coordinate system. This is explained in more detail in FIG. 2B steps 226 to 230.

Figure 2C:
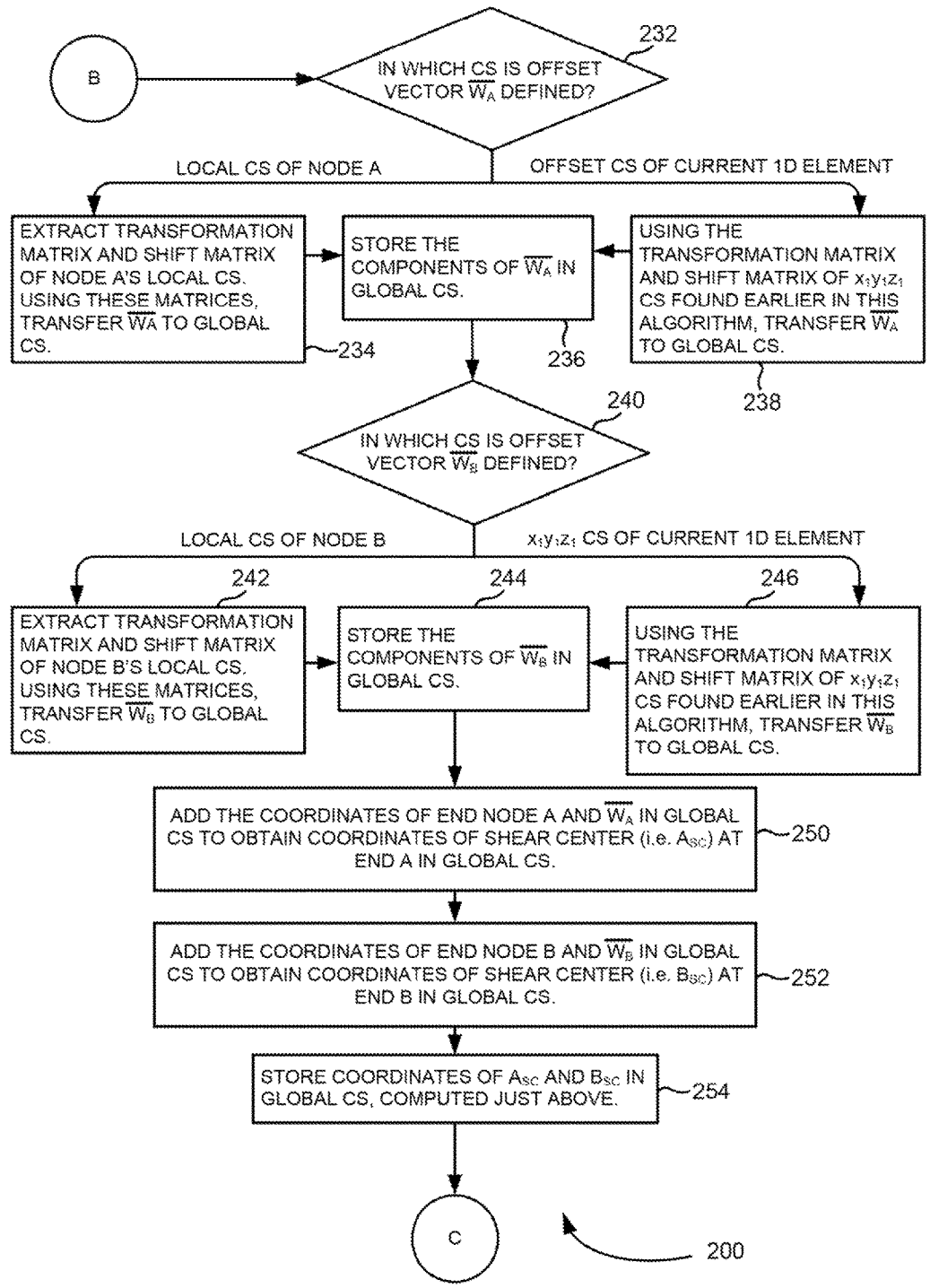

In block 110, all the geometric entities of the current 1D element defined in the offset coordinated system are transformed from the offset coordinate system to the global coordinate system using the generated transformation matrix and the shift matrix of each associated coordinated system. This is explained in more detail in FIG. 2C steps 232 to 246.

In block 112, an elemental coordinate system associated with the current 1D element is formulated and then an associated transformation matrix and shift matrix are generated. In some embodiments, the type of coordinate system of the offset vectors is determined. If the offset vectors are defined in the local coordinate system of the corresponding end node, then the offset vectors are transformed from the local coordinate system to the global coordinate system using the transformation matrix and shift matrix of the local coordinate system. If the offset vectors are defined in the offset coordinate system of the current 1D element, then the offset vectors are transformed to the global coordinate system using the transformation matrix and the shift matrix of the offset coordinate system.

Figure 2D:
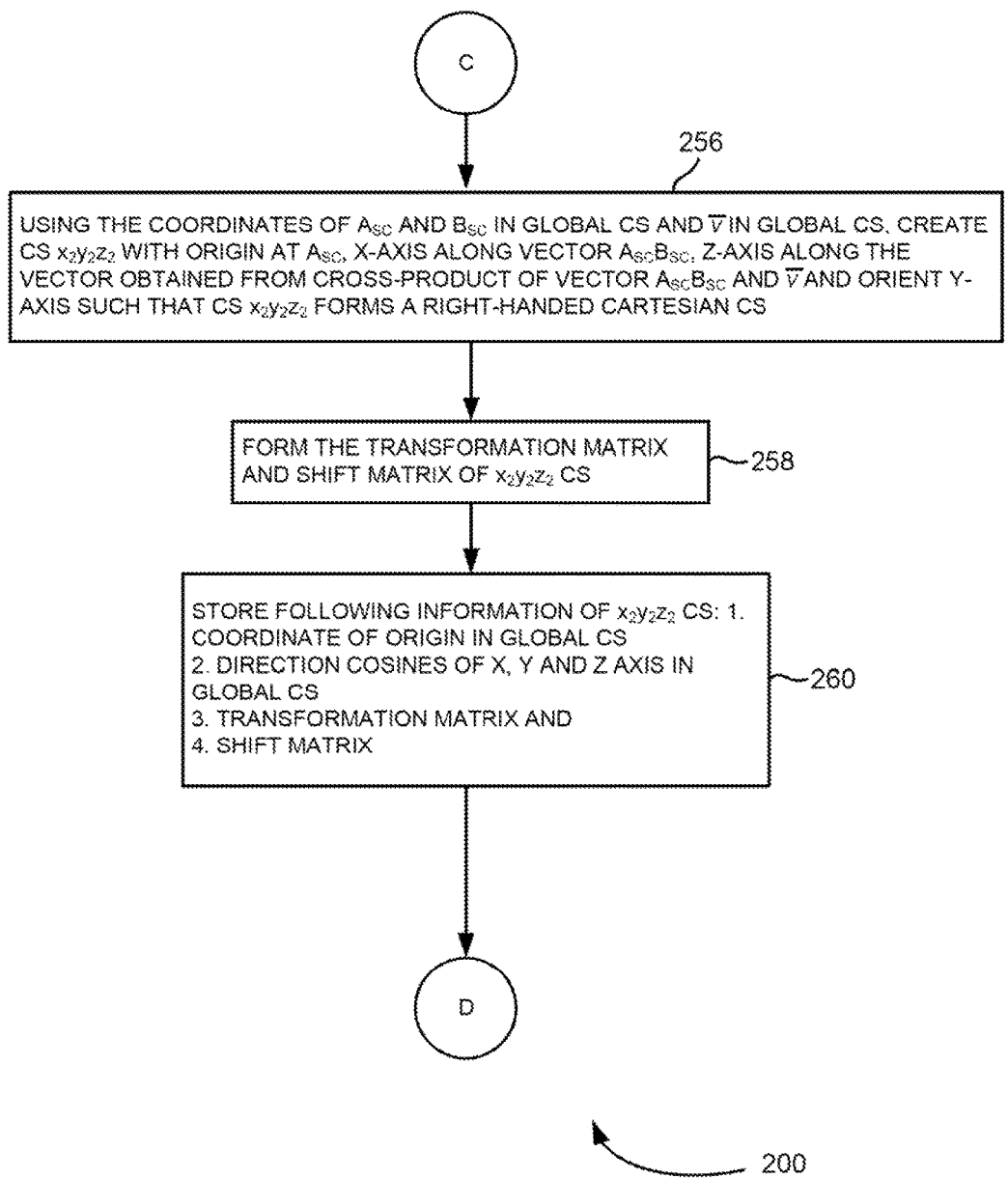
Figure 2E:
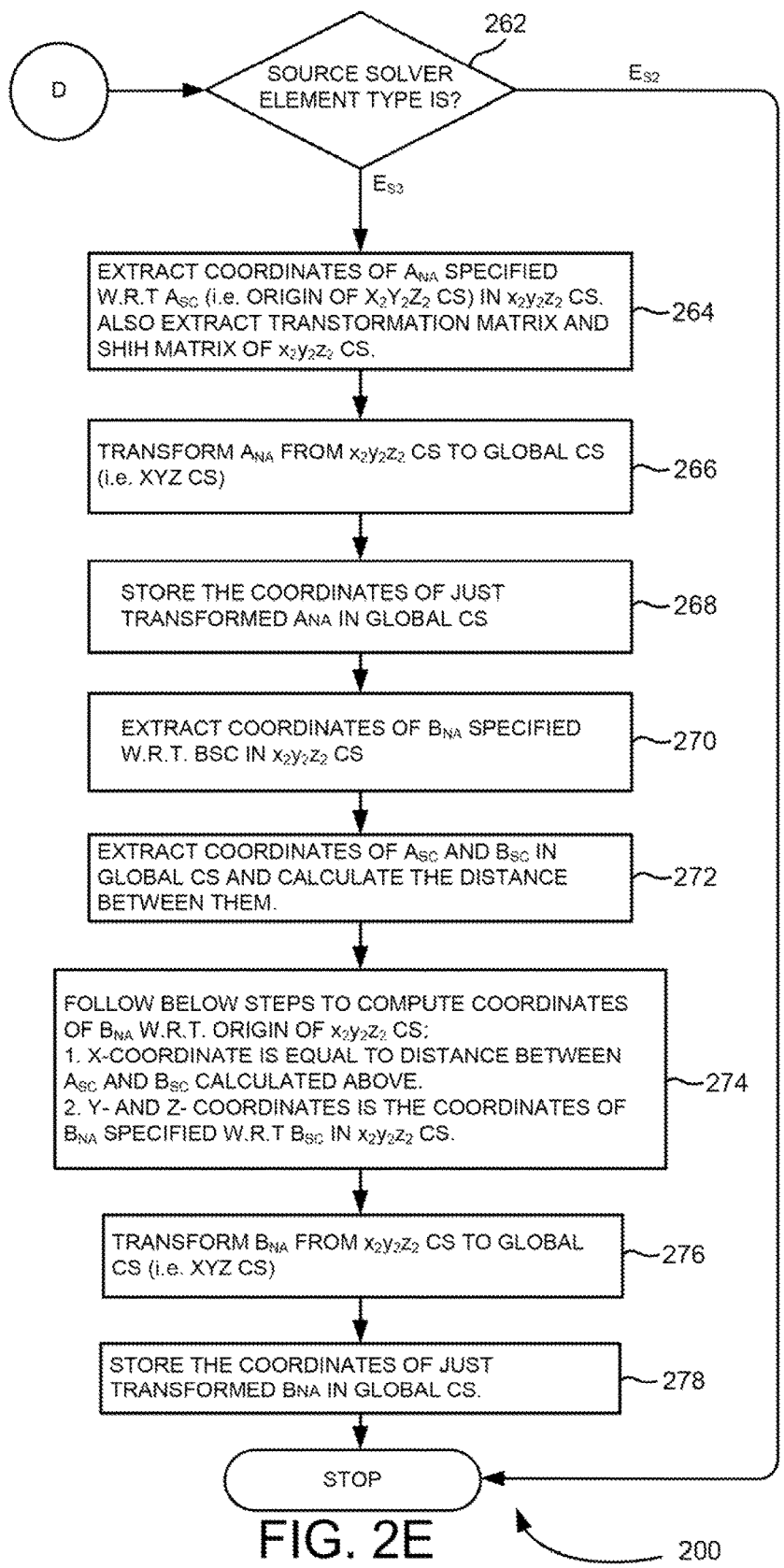

In these embodiments a shear center of both end nodes in the current 1D element in the FEM is obtained in the global coordinate system by a vector addition of global coordinates of corresponding end node and the associated offset vector in global coordinate system. The offset vector and shear center associated to each end node of the current 1D element is then transformed from their respective coordinate system to global coordinate system. The elemental coordinate system of the current 1D element in the FEM is formulated using the coordinates of shear center at each end in global coordinate system and the orientation vector in the global coordinate system. The transformation matrix and the shift matrix of each formulated elemental coordinate system is then generated using the formulated elemental coordinate system in the global coordinate system. This is explained in more detail in FIGS. 2C, 2D and 2E steps 250 to 264.

Figure 3:
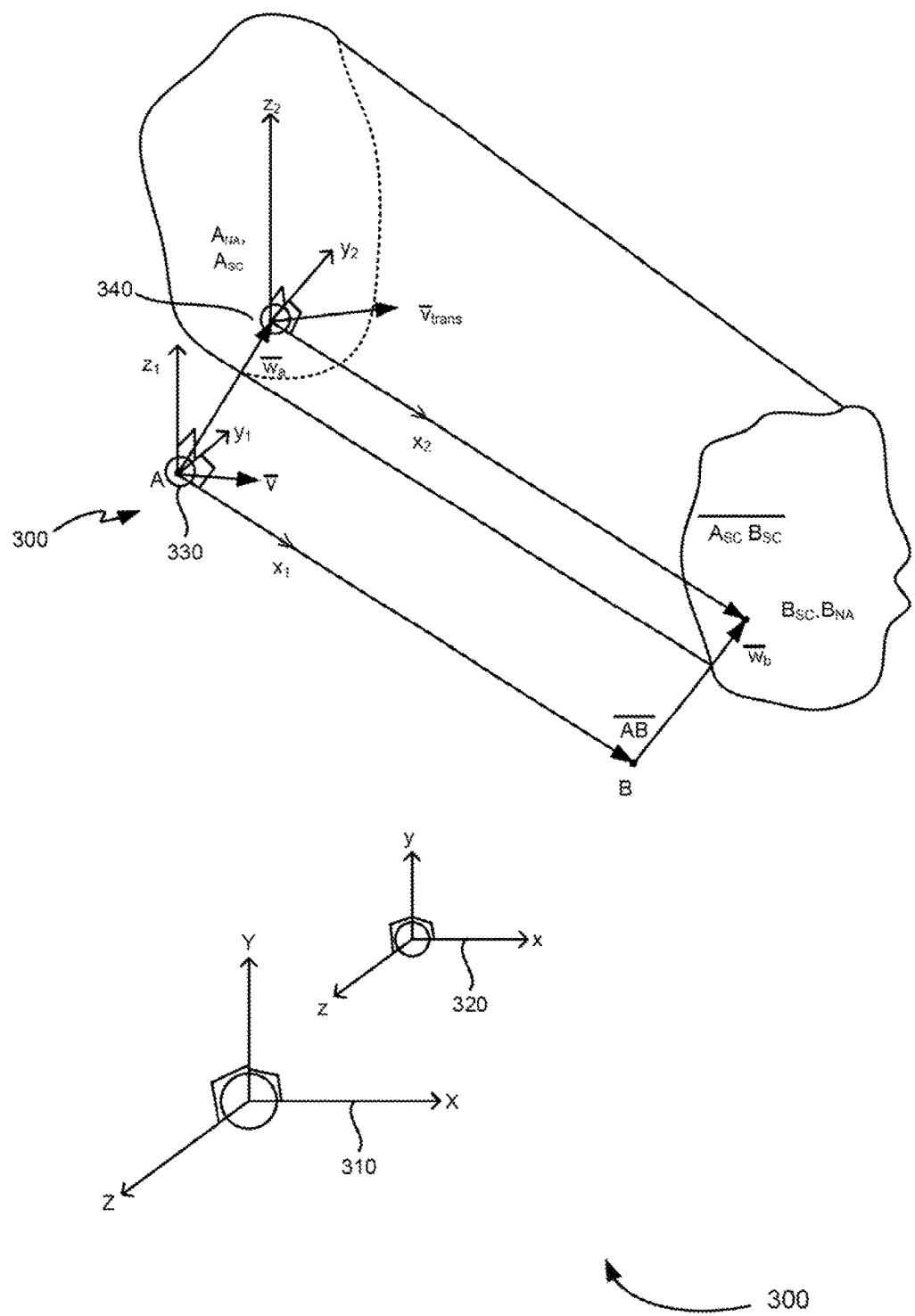
FIG. 3 shows a schematic diagram of a prismatic beam modeled as 1D element of type $E_{S2}$ for FEA in a FEA tool, according to one embodiment.

FIG. 3 shows an example beam element 300, such as a straight prismatic beam having a coincident Shear centre (SC) and a Center of gravity (CG). In FEA, such beams are modeled as 1D element with grid points/nodes located at ends A and B as shown in FIG. 3. Location of these grid points is specified in a local coordinate system (x, y, z) which is itself defined in global coordinate system (X, Y, Z). This beam element is similar to Nastran's CROD element type having stiffness in bending and transverse shear direction. In these elements, defining elemental coordinate systems becomes mandatory and is formulated using orientation vector v and two end nodes/grid points of element in discussion. Coordinate system $(x_1, y_1, z_1)$ as shown in FIG. 3, which is referred to as offset coordinate systems in Nastran and elemental coordinate system in Abaqus, is formulated using end points A and B of the beam element 300 and orientation vector v specified by a user/modeler. Further, it is possible that shear center (SC) may not be coincident with end grid points/nodes of element and in such cases, location of the SC is specified by providing the shear center offset vectors $w_A$ and $w_B$ as shown in FIG. 3. These shear center offset vectors define the location of SC at an end with respect to grid point/node at the corresponding end. Finally, the orientation vector v originally starting from the end grid point/node A, is translated by $w_A$ in the $x_1y_1z_1$ coordinate system and now starts at the point $A_{SC}$; this translated vector is shown in FIG. 3 by $v_{trans}$. CS $x_2y_2z_2$ with origin at $A_{SC}$ is then formulated using the two points $A_{SC}$ and $B_{SC}$ and the vector $v_{trans}$. This is referred to as the elemental CS of 1D element in Nastran.

It can be seen from FIG. 3 that source solver $S_{S2}$ having element type $E_{S2}$, provides following features to a user:
  Orientation vector v can be defined in either the global coordinate system or in the local coordinate system.
  Offset vectors $w_A$ and $w_B$ can be defined in either the local coordinate system or in $x_1y_1z_1$ coordinate system (i.e., Nastran's offset coordinate system).
  Further source solver has the feature of providing different offset vector at two ends.

As shown in FIG. 3, neutral axis (NA) at a particular end coincides with SC at that end. Hence, no provision for specifying NA is given when a source solver element type $E_{S2}$ has coincidental locations of SC and NA at ends. In these embodiments, the destination solver may be a bit restrictive and may provide limited option to user in terms of defining the orientation vector, v, and offset vectors, $w_A$ and $w_B$. This is explained in more detail below:

In such a scenario, orientation vector v can be defined only in global coordinate system. Offset vectors $w_A$ and $w_B$ need to be same, should lie in plane parallel to $y_1$-$z_1$ plane passing thru corresponding grid point at that end and should be defined in $x_1y_1z_1$ coordinate system. (i.e. Abaqus's elemental coordinate system). NA offset at a particular end is defined with respect to grid point/node at that end should lie in plane parallel to $y_1$-$z_1$ plane passing thru grid point/node of that end and should be defined in $x_1y_1z_1$ coordinate system (i.e., Abacus's elemental coordinate system).

Figure 4:
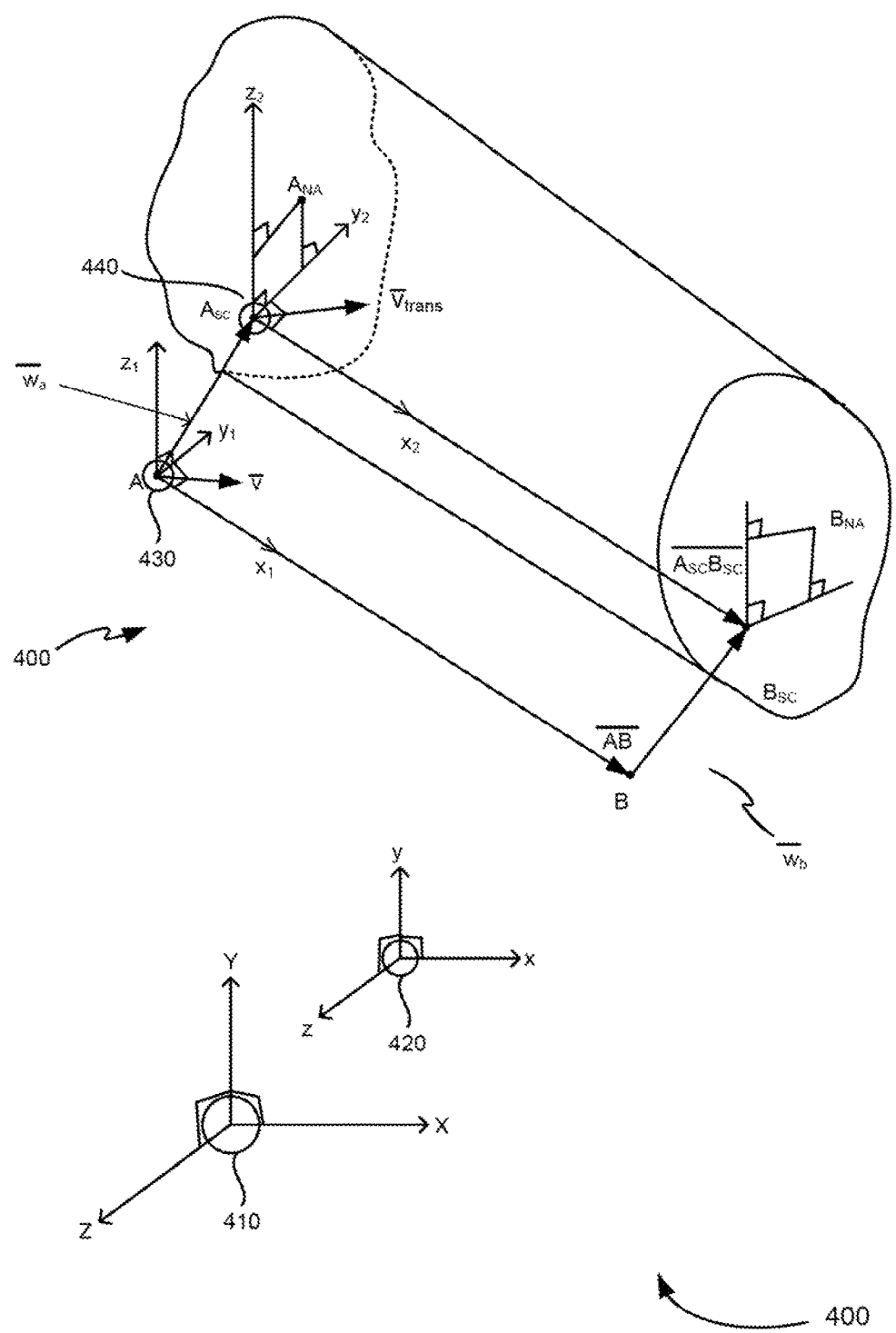
FIG. 4 shows a schematic diagram of a prismatic beam modeled as 1D element of the type $E_{S3}$ for FEA in a FEA tool, according to one embodiment.

FIG. 4 shows an example beam element 400, such as a straight prismatic beam having element type $E_{S3}$ of source solver $S_{S3}$ having all the capabilities of element type $E_{S2}$, in FIG. 3, discussed above, with the following additional capabilities:
  Different cross-section (C/S) properties n be defined at both ends and
  SC and NA at ends need not coincide. This feature enables modeller/analysts/user to model unsymmetrical sections like C-section, L-section, and the like.

Differences related to NA of $E_{S3}$ type 1D element between source and destination solver and its conversion are as follows:
  Geometry of source solver element type $E_{S3}$ is same as that of $E_{S2}$ with the only difference of SC and NA need not coincide at ends.
  In element type $E_{S3}$, the location of NA at an end should lie in the plane parallel to $y_2$-$z_2$ plane passing thru SC of that end. Therefore, $A_{NA}$ at end A will lie in plane parallel to $y_2$-$z_2$ plane and passing thru $A_{SC}$ and similarly $B_{NA}$ at end B will lie in plane parallel to $y_2$-$z_2$ plane and passing thru $B_{SC}$ (see FIG. 4). As NA and SC at an end are located in the same plane and location of SC is already known, hence only Y and Z coordinates of NA in $x_2y_2z_2$ coordinate system at the end is needed to locate it. Whereas, in all the destination solver element types, location of NA at an end is specified with respect to grid point/node (i.e. either point A or B) of that end and hence, location of NA at an end should lie in the plane parallel to $y_1$-$z_1$ plane passing grid point/node of that end. Also, unlike source solver element type $E_{S3}$, in destination solver element types NA offset at both ends should be same.

In block 114, all the geometric entities of the current 1D element defined in the elemental coordinate system is transformed from the elemental coordinate system to the global coordinate system using the generated transformation matrix and the shift matrix of associated elemental coordinate system. This is explained in more detail in FIG. 2E and steps 264 to 278.

In block 116, the geometric entities of the current 1D element in the source FEA tool format is converted to the destination FEA tool format using the transformed local, offset, and elemental coordinate system to the global coordinate system. In block 118, blocks 102 to 116 are repeated for a next 1D element until the conversion of all the 1D elements in the FEM that are in the source FEA tool format to destination FEA tool format is completed.

In some embodiments, the neutral axis coordinates associated with each node of the current 1D element is transformed from the elemental coordinate system to the global coordinate system using the formed transformation matrix and the shift matrix in the elemental coordinate system. In these embodiments, the neutral axis coordinates associated with each node in the current 1D element is extracted with respect to the elemental coordinate system. The neutral axis coordinates associated with each node in the current 1D element is then transformed from the elemental coordinate system to the global coordinate system using the formed transformation matrix and the shift matrix in the elemental coordinate system.

Example Computing System Implementation

Figure 5:
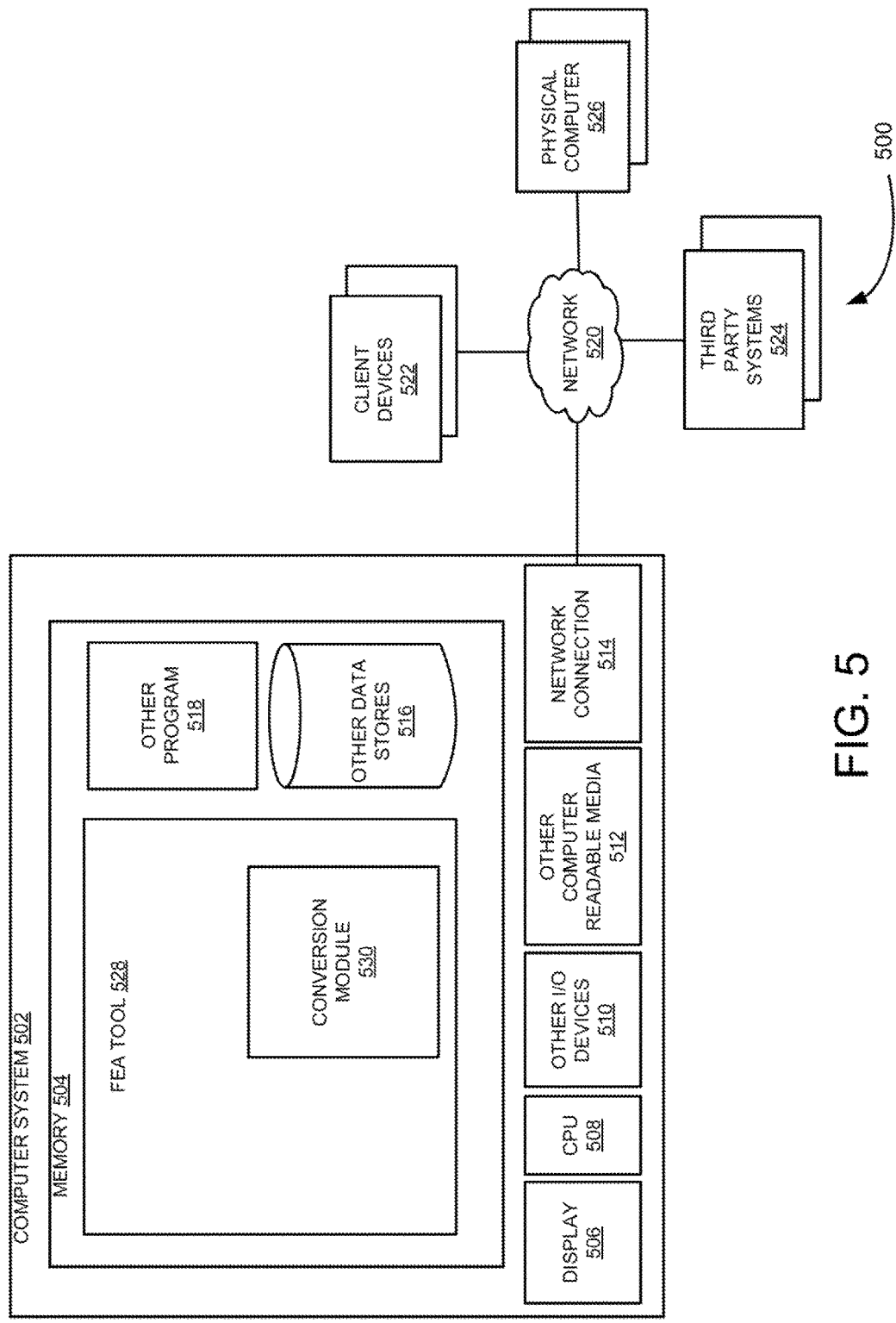
FIG. 5 illustrates a block diagram of an example computing system for implementing conversion of geometric entities of one or more 1D elements in a FEM created in a source FEA tool format to a destination FEA tool format, using the processes shown in FIGS. 1 and 2, according to one embodiment.

FIG. 6 is a block diagram of an example computing system for performing conversion of geometric entities of 1D elements in FEM from one FEA tool format to another FEA tool format, according to an example embodiment. In particular, FIG. 5 shows a computing system 500 that may be utilized to implement a conversion module 530 within a FEA tool 528.

Note that one or more general purpose virtual or physical computer systems suitably instructed may be used to implement the conversion module 530. In addition, the computing system 500 may comprise one or more distinct computing systems/devices and may span distributed locations. Furthermore, each block shown may represent one or more such blocks as appropriate to a specific embodiment or may be combined with other blocks. Also, the conversion module within the FEA tool 528 may be implemented in software, hardware, firmware, or in some combination to achieve the capabilities described herein.

In the embodiment shown, computing system 500 may comprise a computer memory ("memory") 501, a display 502, one or more Central Processing Units ("CPU") 503, Input/Output devices 504 (e.g., keyboard, mouse, etc.), other computer-readable media 505, and network connections 506. The conversion module 530 within the FEA tool 528 is shown residing in memory 501. The components of the conversion module 530 may execute on one or more CPUs 503 and implement techniques described herein. Other code or programs 530 (e.g., an administrative interface, a Web server, and the like) and potentially other data repositories, such as data store 520, may also reside in the memory 501, and execute on one or more CPUs 503. One or more of the components in FIG. 5 may not be present in any specific implementation. For example, some embodiments may not provide other computer readable media 505 or a display 502.

The conversion module 530 interacts via the network 150 with client devices 120, physical computers 130, and/or third-party systems/applications 555. The network 150 may be any combination of media (e.g., twisted pair, coaxial, fiber optic, radio frequency), hardware (e.g., routers, switches, repeaters, transceivers), and protocols (e.g., TCP/IP, UDP, Ethernet, Wi-Fi, WiMAX) that facilitate communication to and from remotely situated humans and/or devices. The third-party systems/applications 555 may include any systems that provide data to, or utilize data from, the conversion module 530, including remote management/monitoring consoles, performance profilers, activity trackers, or the like.

As discussed, the conversion module 530 dynamically converts geometric entities of 1D elements in a FEM from one FEA tool format to another. The architecture shown in FIG. 5 may in some embodiments be partially or fully virtualized. For example, the computer system 500 may be one or possibly many VMs executing on physical hardware and managed by a hypervisor, virtual machine monitor, or similar technology.

In an example embodiment components/modules of the conversion module 530 are implemented using standard programming techniques. For example, the conversion module 530 may be implemented as a "native" executable running on the CPU 503, along with one or more static or dynamic libraries. In other embodiments, the conversion module 530 may be implemented as instructions processed by a virtual machine (VM) that executes as one of the other programs 530. In general, a range of programming languages known in the art may be employed for implementing such example embodiments, including representative implementations of various programming language paradigms, including but not limited to, object-oriented (e.g., Java, C++, C#, Visual Basic.NET, Smalltalk, and the like), functional (e.g., ML, Lisp, Scheme, and the like), procedural (e.g., C, Pascal, Ada, Module, and the like), scripting (e.g., Pen, Ruby, Python, JavaScript, VBScript, and the like), and declarative (e.g., SQL, Prolog, and the like).

The embodiments described above may also use either well-known or proprietary synchronous or asynchronous client-server computing techniques. Also, the various components may be implemented using more monolithic programming techniques, for example, as an executable running on a single CPU computer system, or alternatively decomposed using a variety of structuring techniques known in the art, including but not limited to, multiprogramming, multithreading, client-server, or peer-to-peer, running on one or more computer systems each having one or more CPUs. Some embodiments may execute concurrently and asynchronously, and communicate using message passing techniques. Equivalent synchronous embodiments are also supported. Also, other functions could be implemented and/or performed by each component/module, and in different orders, and by different components/modules, yet still achieve the described functions.

In addition, programming interfaces to the data stored as part of the conversion module 530, such as in the data store 103 or 520, can be available by standard mechanisms such as through C, C++, C#, and Java APIs; libraries for accessing files, databases, or other data repositories; through scripting languages such as XML; or through Web servers, FTP servers, or other types of servers providing access to stored data. The data store 520 may be implemented as one or more database systems, file systems, or any other technique for storing such information, or any combination of the above, including implementations using distributed computing techniques.

Different configurations and locations of programs and data are contemplated for use with techniques of described herein. A variety of distributed computing techniques are appropriate for implementing the components of the illustrated embodiments in a distributed manner including but not limited to TCP/IP sockets, WebSockets, RPC, RMI, HTTP, web services (XML-RPC, JAX-RPC, SOAP, and the like). Other variations are possible. Also, other functionality could be provided by each component/module, or existing functionality could be distributed amongst the components/modules in different ways, yet still achieve the functions described herein.

Furthermore, in some embodiments, some or all of the components of the conversion module 530 may be implemented or provided in other manners, such as at least partially in firmware and/or hardware, including, but not limited to one or more application-specific integrated circuits ("ASICs"), standard integrated circuits, controllers executing appropriate instructions, and including microcontrollers and/or embedded controllers, field-programmable gate arrays ("FPGAs"), complex programmable logic devices ("CPLDs"), and the like. Some or all of the system components and/or data structures may also be stored as contents (e.g., as executable or other machine-readable software instructions or structured data) on a computer-readable medium (e.g., as a hard disk; a memory; a computer network or cellular wireless network or other data transmission medium; or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques. Some or all of the components and/or data structures may be stored on tangible, non-transitory storage mediums. Some or all of the system components and data structures may also be provided as data signals (e.g., by being encoded as part of a carrier wave or included as part of an analog or digital propagated signal) on a variety of computer-readable transmission mediums, which are then transmitted, including across wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of this disclosure may be practiced with other computer system configurations.

Although certain methods, systems, apparatus, and articles of manufacture have been described herein, the scope of coverage of this patent is not limited thereto. To the contrary, this patent covers all methods, apparatus, and articles of manufacture fairly falling within the scope of the appended claims either literally or under the doctrine of equivalents.

What is claimed is:

1. A method of converting geometric entities of 1D elements in a finite element model (FEM) from a source finite element analysis (FEA) tool format to a destination FEA tool format, comprising:
    transforming the coordinates of all the geometric entities associated with each 1D element in the FEM, in the source FEA tool format, from a local coordinate system to a global coordinate system; and
    converting the geometric entities of the 1D elements from the source FEA tool format to the destination FEA tool format using the transformed coordinates of all the geometric entities associated with each 1D element.

2. The method of claim 1, wherein transforming the coordinates of all the geometric entities associated with each 1D element in the FEM, in the source FEA tool format, from the local coordinate system to the global coordinate system, comprises:
    generating a transformation matrix and a shift matrix for each local coordinate system in the FEM in the source FEA tool format;
    transforming coordinates of each node in a current 1D element from the local coordinate system to the global coordinate system using the generated transformation matrix and the shift matrix associated with the local coordinate system;
    transforming orientation vector of the current 1D element from the local coordinate system to the global coordinate system using the generated transformation matrix and the shift matrix associated with the local coordinate system;
    formulating an offset coordinate system and generating an associated transformation matrix and shift matrix using coordinates of end nodes of the current 1D element and the transformed orientation vector in the global coordinate system;
    transforming all the geometric entities of the current 1D element defined in the offset coordinate system from the offset coordinate system to the global coordinate system using the generated transformation matrix and the shift matrix of each associated offset coordinate system;
    formulating an elemental coordinate system of the current 1D element and generating associated transformation matrix and shift matrix; and
    transforming all the geometric entities of the current 1D element defined in the elemental coordinate system from the elemental coordinate system to the global coordinate system using the generated transformation matrix and the shift matrix of associated elemental coordinate system.

3. The method of claim 2, wherein transforming the orientation vector of the current 1D element from the local coordinate system to the global coordinate system using the generated transformation matrix and the shift matrix associated with the local coordinate system, comprises:
    determining whether an orientation vector or a third node is specified for the current 1D element in the FEM to create the offset coordinate system;
    if orientation is defined using the orientation vector, and is in the local coordinate system then transforming the orientation vector of the current 1D element from the local coordinate system to the global coordinate system using the generated transformation matrix and the shift matrix associated with the local coordinate system; and
    if orientation of the current 1D element in the FEM is defined using the third node, then extracting the transformation matrix and shift matrix in which the third node of the current 1D element is defined, transforming the coordinates of the third node from the local coordinate system to the global coordinate system, and forming the orientation vector in the global coordinate system with the tail at first node in the element connectivity of the current 1D element and the head at the third node, using the coordinates of both nodes in global coordinate system.

4. The method of claim 2, wherein formulating the elemental coordinate system of the current 1D element and generating associated transformation matrix and shift matrix, comprises:
    determining a coordinate system of offset vectors;
    if the offset vectors are defined in the local coordinate system of the corresponding end node, then transforming the offset vectors from the local coordinate system to the global coordinate system using the transformation matrix and shift matrix of the local coordinate system;

if the offset vectors are defined in the offset coordinate system of the current 1D element, then transforming the offset vectors to the global coordinate system using the transformation matrix and the shift matrix of the offset coordinate system;

obtaining a shear center of both end nodes in the current 1D element in the FEM in the global coordinate system by vector addition of global coordinates of corresponding end node and the associated offset vector in global coordinate system;

transformation of the offset vector and shear center associated to each end node of the current 1D element from their respective coordinate system to global coordinate system;

formulating the elemental coordinate system of the current 1D element in the FEM using the coordinates of shear center at each end in global coordinate system and the orientation vector in the global coordinate system; and generating the transformation matrix and the shift matrix of each formulated elemental coordinate system using the formulated elemental coordinate system in the global coordinate system.

5. The method of claim 1, further comprising:
transforming a neutral axis coordinates associated with each node of the current 1D element from the elemental coordinate system to the global coordinate system using the formed transformation matrix and the shift matrix in the elemental coordinate system.

6. The method of claim 5, wherein transforming the neutral axis coordinates associated with each node in the current 1D element from the elemental coordinate system to the global coordinate system, comprises:
extracting the neutral axis coordinates associated with each node in the current 1D element with respect to the elemental coordinate system; and
transforming the neutral axis coordinates associated with each node in the current 1D element from the elemental coordinate system to the global coordinate system using the formed transformation matrix and the shift matrix in the elemental coordinate system.

7. The method of claim 2, wherein converting the geometric entities of the 1D elements from the source FEA tool format to the destination FEA tool format using the transformed coordinates of all the geometric entities associated with each 1D element, comprises:
converting the geometric entities of the current 1D element in the source FEA tool format to the destination FEA tool format using the transformed local, offset and elemental coordinate system to the global coordinate system.

8. The method of claim 7, further comprising:
repeating the steps of claims 2 and 7 for a next 1D element until the conversion of all the 1D elements in the FEM that are in the source FEA tool format are completed.

9. A non-transitory computer storage medium having instructions that, when executed by a computing device cause the computing device to:
transform the coordinates of all the geometric entities associated with each 1D element in an FEM, in a source FEA tool format, from a local coordinate system to a global coordinate system; and
convert the geometric entities of the 1D elements from the source FEA tool format to a destination FEA tool format using the transformed coordinates of all the geometric entities associated with each 1D element.

10. The non-transitory computer storage medium of claim 9, wherein transforming the coordinates of all the geometric entities associated with each 1D element in the FEM, in the source FEA tool format, from the local coordinate system to the global coordinate system, comprises:
generating a transformation matrix and a shift matrix for each local coordinate system in the FEM in the source FEA tool format;
transforming coordinates of each node in a current 1D element from the local coordinate system to t global coordinate system using the generated transformation matrix and the shift matrix associated with the local coordinate system;
transforming orientation vector of the current 1D element from the local coordinate system to the global coordinate system using the generated transformation matrix and the shift matrix associated with the local coordinate system;
formulating an offset coordinate system and generating an associated transformation matrix and shift matrix using coordinates of end nodes of the current 1D element and the transformed orientation vector in the global coordinate system;
transforming all the geometric entities of the current 1D element defined in the offset coordinate system from the offset coordinate system to the global coordinate system using the generated transformation matrix and the shift matrix of each associated offset coordinate system;
formulating an elemental coordinate system of the current 1D element and generating associated transformation matrix and shift matrix; and
transforming all the geometric entities of the current 1D element defined in the elemental coordinate system from the elemental coordinate system to the global coordinate system using the generated transformation matrix and the shift matrix of associated elemental coordinate system.

11. The non-transitory computer storage medium of claim 10, wherein transforming the orientation vector of the current 1D element from the local coordinate system to the global coordinate system using the generated transformation matrix and the shift matrix associated with the local coordinate system, comprises:
determining whether an orientation vector or a third node is specified for the current 1D element in the FEM to create the offset coordinate system;
if orientation is defined using the orientation vector, and is in the local coordinate system then transforming the orientation vector of the current 1D element from the local coordinate system to the global coordinate system using the generated transformation matrix and the shift matrix associated with the local coordinate system; and
if orientation of the current 1D element in the FEM is defined using the third node, then extracting the transformation matrix and shift matrix in which the third node of the current 1D element is defined, transforming the coordinates of the third node from the local coordinate system to the global coordinate system, and forming the orientation vector in the global coordinate system with the tail at first node in the element connectivity of the current 1D element and the head at the third node, using the coordinates of both nodes in global coordinate system.

12. The non-transitory computer storage medium of claim 10, wherein formulating the elemental coordinate system of the current 1D element and generating associated transformation matrix and shift matrix, comprises:
  determining a coordinate system of offset vectors;
  if the offset vectors are defined in the local coordinate system of the corresponding end node, then transforming the offset vectors from the local coordinate system to the global coordinate system using the transformation matrix and shift matrix of the local coordinate system;
  if the offset vectors are defined in the offset coordinate system of the current 1D element, then transforming the offset vectors to the global coordinate system using the transformation matrix and the shift matrix of the offset coordinate system;
  obtaining a shear center of both end nodes in the current 1D element in the FEM in the global coordinate system by vector addition of global coordinates of corresponding end node and the associated offset vector in global coordinate system;
  transformation of the offset vector and shear center associated to each end node of the current 1D element from their respective coordinate system to global coordinate system;
  formulating the elemental coordinate system of the current 1D element in the FEM using the coordinates of shear center at each end in global coordinate system and the orientation vector in the global coordinate system; and
  generating the transformation matrix and the shift matrix of each formulated elemental coordinate system using the formulated elemental coordinate system in the global coordinate system.

13. The non-transitory computer storage medium of claim 9, further comprising:
  transforming a neutral axis coordinates associated with each node of the current 1D element from the elemental coordinate system to the global coordinate system using the formed transformation matrix and the shift matrix in the elemental coordinate system.

14. The non-transitory computer storage medium of claim 13, wherein transforming the neutral axis coordinates associated with each node in the current 1D element from the elemental coordinate system to the global coordinate system, comprises:
  extracting the neutral axis coordinates associated with each node in the current 1D element with respect to the elemental coordinate system; and
  transforming the neutral axis coordinates associated with each node in the current 1D element from the elemental coordinate system to the global coordinate system using the formed transformation matrix and the shift matrix in the elemental coordinate system.

15. The non-transitory computer storage medium of claim 10, wherein converting the geometric entities of the 1D elements from the source FEA tool format to the destination FEA tool format using the transformed coordinates of all the geometric entities associated with each 1D element, comprises:
  converting the geometric entities of the current 1D element in the source FEA tool format to the destination FEA tool format using the transformed local, offset and elemental coordinate system to the global coordinate system.

16. The non-transitory computer storage medium of claim 15, further comprising:
  repeating the steps of claims 2 and 7 for a next 1D element until the conversion of all the 1D elements in the FEM that are in the source FEA tool format are completed.

17. A system comprising:
  a processor; and
  a memory coupled to the processor, wherein the memory includes a FEA tool having instructions to:
    transform the coordinates of all the geometric entities associated with each 1D element in an FEM, in a source FEA tool format, from a local coordinate system to a global coordinate system; and
    convert the geometric entities of the 1D elements from the source FEA tool format to a destination FEA tool format using the transformed coordinates of all the geometric entities associated with each 1D element.

18. The system of claim 17, wherein the FEA tool generates a transformation matrix and a shift matrix for each local coordinate system in the FEM in the source FEA tool format;
  wherein the FEA tool transforms coordinates of each node in a current 1D element from the local coordinate system to the global coordinate system using the generated transformation matrix and the shift matrix associated with the local coordinate system;
  wherein the FEA tool transforms orientation vector of the current 1D element from the local coordinate system to the global coordinate system using the generated transformation matrix and the shift matrix associated with the local coordinate system;
  wherein the FEA tool formulates an offset coordinate system and generating an associated transformation matrix and shift matrix using coordinates of end nodes of the current 1D element and the transformed orientation vector in the global coordinate system;
  wherein the FEA tool transforms all the geometric entities of the current 1D element defined in the offset coordinate system from the offset coordinate system to the global coordinate system using the generated transformation matrix and the shift matrix of each associated offset coordinate system;
  wherein the FEA tool formulates an elemental coordinate system of the current 1D element and generating associated transformation matrix and shift matrix; and
  wherein the FEA tool transforms all the geometric entities of the current 1D element defined in the elemental coordinate system from the elemental coordinate system to the global coordinate system using the generated transformation matrix and the shift matrix of associated elemental coordinate system.

19. The system of claim 17, wherein the FEA tool determines whether an orientation vector or a third node is specified for the current 1D element in the FEM to create the offset coordinate system;
  wherein the FEA tool transforms the orientation vector of the current 1D element from the local coordinate system to the global coordinate system using the generated transformation matrix and the shift matrix associated with the local coordinate system if orientation is defined using the orientation vector, and is in the local coordinate system then; and
  wherein the FEA tool extracts the transformation matrix and shift matrix in which the third node of the current 1D element is defined, transforming the coordinates of the third node from the local coordinate system to the global coordinate system, and forming the orientation vector in the global coordinate system with the tail at first node in the element connectivity of the current 1D element and the head at the third node, using the coordinates of both nodes in global coordinate system if orientation of the current 1D element in the FEM is defined using the third node.

20. The system of claim 17, wherein the FEA tool determines a type of coordinate system of offset vectors,
wherein the FEA tool transforms the offset vectors from the local coordinate system to the global coordinate system using the transformation matrix and shift matrix of the local coordinate system if the offset vectors are defined in the local coordinate system of the corresponding end node;
wherein the FEA tool transforms the offset vectors to the global coordinate system using the transformation matrix and the shift matrix of the offset coordinate system if the offset vectors are defined in the offset coordinate system of the current 1D element, then;
wherein the FEA tool obtains a shear center of both end nodes in the current 1D element in the FEM in the global coordinate system by vector addition of global coordinates of corresponding end node and the associated offset vector in global coordinate system;
wherein the FEA tool transforms the offset vector and shear center associated with each end node of the current 1D element from their respective coordinate system to global coordinate system;
wherein the FEA tool formulates the elemental coordinate system of the current 1D element in the FEM using the coordinates of shear center at each end in global coordinate system and the orientation vector in the global coordinate system; and
wherein the FEA tool generates the transformation matrix and the shift matrix of each formulated elemental coordinate system using the formulated elemental coordinate system in the global coordinate system.

21. The system of claim 17, wherein the FEA tool transforms a neutral axis coordinates associated with each node of the current 1D element from the elemental coordinate system to the global coordinate system using the formed transformation matrix and the shift matrix in the elemental coordinate system.

* * * * *